(12) United States Patent
Craes et al.

(10) Patent No.: US 11,715,647 B2
(45) Date of Patent: Aug. 1, 2023

(54) METHOD FOR PRODUCING A SUBSTRATE

(71) Applicant: Infineon Technologies AG, Neubiberg (DE)

(72) Inventors: Fabian Craes, Soest (DE); Carsten Ehlers, Moenchengladbach (DE); Olaf Hohlfeld, Warstein (DE); Ulrich Wilke, Soest (DE)

(73) Assignee: Infineon Technologies AG, Neubiberg (DE)

( * ) Notice: Subject to any disclaimer, the term of this patent is extended or adjusted under 35 U.S.C. 154(b) by 50 days.

(21) Appl. No.: 17/342,975

(22) Filed: Jun. 9, 2021

(65) Prior Publication Data

US 2021/0398821 A1  Dec. 23, 2021

(30) Foreign Application Priority Data

Jun. 17, 2020 (DE) .......................... 102020115990.0

(51) Int. Cl.
| | |
|---|---|
| H01L 21/54 | (2006.01) |
| H01L 21/48 | (2006.01) |
| H01L 21/308 | (2006.01) |
| H01L 21/56 | (2006.01) |
| H01L 21/67 | (2006.01) |
| H01L 23/00 | (2006.01) |

(52) U.S. Cl.
CPC ............ *H01L 21/54* (2013.01); *H01L 21/308* (2013.01); *H01L 21/4857* (2013.01); *H01L 21/56* (2013.01); *H01L 21/67069* (2013.01); *H01L 24/27* (2013.01)

(58) Field of Classification Search
CPC ........ H01L 21/56; H01L 21/308; H01L 24/27
See application file for complete search history.

(56) References Cited

U.S. PATENT DOCUMENTS

| | | | | |
|---|---|---|---|---|
| 6,139,904 A | * | 10/2000 | Yamasaki ............ | H05K 3/4069 |
| | | | | 427/98.3 |
| 7,609,504 B2 | * | 10/2009 | Park ...................... | H01G 4/206 |
| | | | | 361/321.1 |
| 10,672,620 B2 | * | 6/2020 | Ghoneim ............ | H01L 21/3081 |
| 2004/0113283 A1 | * | 6/2004 | Farnworth .............. | H01L 24/05 |
| | | | | 257/E29.022 |

FOREIGN PATENT DOCUMENTS

| | | |
|---|---|---|
| DE | 102013102637 A1 | 9/2014 |
| DE | 102014115815 A1 | 5/2016 |

\* cited by examiner

*Primary Examiner* — Dale E Page
*Assistant Examiner* — Wilner Jean Baptiste
(74) *Attorney, Agent, or Firm* — Murphy, Bilak & Homiller, PLLC

(57) ABSTRACT

A method includes forming a first electrically conductive layer on a first side of a dielectric insulation layer, forming a structured mask layer on a side of the first electrically conductive layer that faces away from the dielectric insulation layer, forming at least one trench in the first electrically conductive layer, said at least one trench extending through the entire first electrically conductive layer to the dielectric insulation layer, forming a coating which covers at least the bottom and the side walls of the at least one trench, and removing the mask layer after the coating has been formed.

14 Claims, 4 Drawing Sheets

FIG 6A  FIG 6B

METHOD FOR PRODUCING A SUBSTRATE

RELATED APPLICATIONS

The instant application claims priority to German Patent Application 102020115990.0 filed on Jun. 17, 2020, the content of which is incorporated by reference herein in its entirety.

TECHNICAL FIELD

The present invention relates to a method for producing a substrate, more particularly a method for producing a substrate for a power semiconductor module.

BACKGROUND

Power semiconductor modules usually comprise one or more semiconductor substrates which can be arranged on a baseplate or on a heat sink. A semiconductor arrangement comprising a multiplicity of controllable semiconductor components (e.g., IGBTs) is arranged on at least one of the substrates. A semiconductor substrate generally comprises an electrically insulating substrate layer (e.g., a ceramic layer), a first electrically conductive layer (e.g., a metal layer) which is arranged on a first side of the substrate layer, and a second electrically conductive layer (e.g., a metal layer) which is arranged on a second side of the substrate layer that is opposite the first side. The controllable semiconductor components are, for example, arranged on the first electrically conductive layer. The second electrically conductive layer is usually connected to the baseplate or the heat sink; this means that it is arranged between the baseplate/the heat sink and the insulating substrate layer.

At least the first electrically conductive layer is generally a structured layer. This means that the layer has multiple sections which are spaced apart from one another and which are separated from one another by continuous incisions in the first electrically conductive layer. Connections between various sections of the first electrically conductive layer are generally established only by electrical connecting elements such as, for example, bonding wires. Various sections of the first electrically conductive layer can be connected with different electric potentials. The difference between various electric potentials of adjacent sections can be up to several kilovolts (kV). In the incisions between the sections, maxima of the electric field strength can therefore occur during the operation of the power semiconductor module. This can lead to electrical failure of the power semiconductor module and to problems in electron flow.

For this reason, specific coatings are commonly introduced into the incisions between two sections of the first electrically conductive layer, which coatings influence (e.g., reduce) the electric field strength and can protect the first electrically conductive layer from undesired adverse effects with regard to electron flow.

There is therefore a need for a method for producing a substrate, by means of which a substrate having a coating in the gaps between the various sections of the first electrically conductive layer can be produced in an effective manner without adversely affecting the function of the finished substrate at the same time.

SUMMARY

A method comprises forming a first electrically conductive layer on a first side of a dielectric insulation layer, forming a structured mask layer on a side of the first electrically conductive layer that faces away from the dielectric insulation layer, forming at least one trench in the first electrically conductive layer, said at least one trench extending through the entire first electrically conductive layer to the dielectric insulation layer, forming a coating which covers at least the bottom and the side walls of the at least one trench, and removing the mask layer after the coating has been formed.

BRIEF DESCRIPTION OF THE DRAWINGS

The invention will now be more particularly elucidated by means of examples and with reference to the figures. Here, the same reference signs refer to the same elements. The illustration in the figures is not to scale.

FIG. 3, which includes

FIG. 6, which includes FIGS. 6A to 6C, shows by way of example various coatings in a gap between two sections of the first electrically conductive layer.

DETAILED DESCRIPTION

In the following detailed description, specific examples will be used to illustrate how the invention can be realized. It is self-evident that the features of the various examples described herein can be combined with one another, unless otherwise stated. Where particular elements are referred to as "first element", "second element", . . . or the like, the indication "first", "second", . . . merely serves to distinguish various elements from one another. An order or listing is not associated with said indication. This means that, for example, a "second element" can be present even when no "first element" is present.

Figure 1:
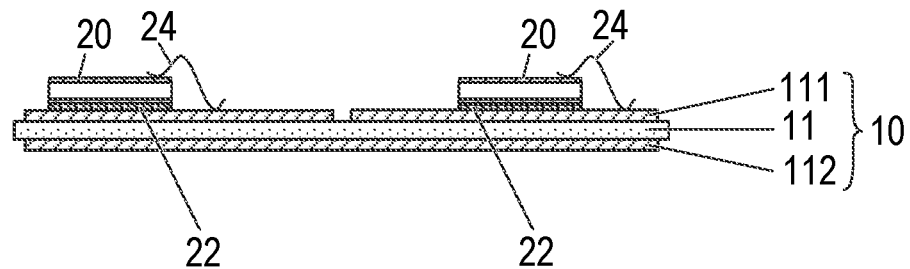
FIG. 1 shows by way of example a cross-section through a substrate having semiconductor bodies arranged thereon.

Referring to FIG. 1, what is depicted is a semiconductor substrate 10. The semiconductor substrate 10 comprises, for example, a dielectric insulation layer 11, a structured first electrically conductive layer 111 and a (structured) second electrically conductive layer 112. The first electrically conductive layer 111 is arranged on a first side of the dielectric insulation layer 11 and the second electrically conductive layer 112 is arranged on a second side of the dielectric insulation layer 11 that is opposite the first side. The dielectric insulation layer 11 is therefore arranged between the first electrically conductive layer 111 and the second electrically conductive layer 112. The second electrically conductive layer is, however, merely optional. It is equally possible to merely arrange the first electrically conductive layer 111 on the dielectric insulation layer 11 and to completely omit the second electrically conductive layer 112.

Each of the first electrically conductive layer 111 and the second electrically conductive layer 112 can consist of one of the following materials or comprise one of the following materials: copper; a copper alloy; aluminum; an aluminum alloy; any other metal or any other metal alloy that remains in a solid state during the operation of the power semiconductor module. The semiconductor substrate 10 can be a ceramic substrate, i.e., a substrate in which the dielectric insulation layer 11 consists of ceramic. Therefore, the dielectric insulation layer 11 can, for example, be a thin ceramic layer. The ceramic of the dielectric insulation layer 11 can, for example, consist of one of the following materials or comprise one of the following materials: aluminum oxide; aluminum nitride; zirconium oxide; silicon nitride; boron nitride; or any other ceramic. For example, the dielectric insulation layer 11 can consist of one of the following materials or comprise one of the following materials: $Al_2O_3$, AlN, or $Si_3N_4$. The semiconductor substrate 10 can, for example, be a so-called direct copper bonding (DCB) substrate, a direct aluminum bonding (DAB) substrate, an insulated metal substrate (IMS) or an active metal brazing (AMB) substrate. The semiconductor substrate 10 can, for example, also be a conventional printed circuit board (PCB) having a nonceramic dielectric insulation layer 11. A nonceramic dielectric insulation layer 11 can, for example, consist of a cured resin or comprise a cured resin.

Additionally referring to FIG. 1, one or more semiconductor bodies 20 can be arranged on the semiconductor substrate 10. Each of the semiconductor bodies 20 on the semiconductor substrate 10 can comprise a diode, an IGBT (insulated-gate bipolar transistor), an MOSFET (metal-oxide-semiconductor field-effect transistor), a JFET (junction-gate field-effect transistor), an HEMT (high-electron-mobility transistor), or any other suitable controllable semiconductor component. The one or more semiconductor bodies 20 can form a semiconductor arrangement on the semiconductor substrate 10. In FIG. 1, only two semiconductor bodies 20 are depicted by way of example.

The first electrically conductive layer 111 depicted in FIG. 1 is a structured layer. In this connection, "structured layer" means that the first electrically conductive layer 111 is not a continuous layer; instead, it has interruptions between various sections of the layer. Various semiconductor bodies 20 can be arranged on the same section or on different sections of the first electrically conductive layer 111. Either the various sections of the first electrically conductive layer 111 can have no electrical connection to one another or they can be connected to one another electrically, for example by means of bonding wires. Each of the semiconductor bodies 20 can be electrically and mechanically connected to the semiconductor substrate 10 by means of an electrically conductive connection layer 22. FIG. 1 shows, by way of example, a semiconductor substrate 10 having connection layers 22 arranged thereon. Such an electrically conductive connection layer 22 can, in principle, be a solder layer, a layer composed of an electrically conductive adhesive or a layer composed of a sintered metal powder, for example a sintered silver powder.

The second electrically conductive layer 112 (if present) can be either a continuous layer or likewise a structured layer.

In order to connect the semiconductor bodies 20 to the semiconductor substrate 10, the semiconductor bodies 20 are arranged on the surface (top surface) of the semiconductor substrate 10, with arrangement of the connection layer 22 between the semiconductor substrate 10 and the semiconductor body 20. The top surface of the semiconductor substrate 10 is a surface of the first electrically conductive layer 111 that faces away from the dielectric insulation layer 11. Alternatively or additionally, the semiconductor bodies 20 can also be connected to the semiconductor substrate 10 by means of bonding wires 24 for example.

The semiconductor substrate 10 having the at least one semiconductor body 20 arranged thereon can, for example, be part of a power semiconductor module and be arranged in a housing (not depicted).

Various sections of the first electrically conductive layer 111 can be connected with different electric potentials. The difference between various electric potentials of adjacent sections can be up to several kilovolts (kV). In the incisions between the sections, maxima of the electric field strength can therefore occur during the operation of the power semiconductor module. This can lead to electrical failure of the power semiconductor module and to problems in electron flow.

For this reason, specific coatings 114 are commonly introduced into the incisions between two sections of the first electrically conductive layer 111, which coatings influence (e.g., reduce) the electric field strength and can protect the first electrically conductive layer 111 from undesired adverse effects with regard to electron flow. Such coatings 114 should cover the bottom and the side walls of the incisions between two sections. If a coating 114 additionally also covers a top side of the first electrically conductive layer 111 at least in part, this can, however, have adverse effects on the function of the semiconductor module.

Now referring to FIG. 3, what is described is a method according to one example, in which a substrate 10 having a coating 114 in the gaps between the various sections of the first electrically conductive layer 111 can be produced in an effective manner without adversely affecting the function of the finished substrate 10 at the same time.

Figure 3A:
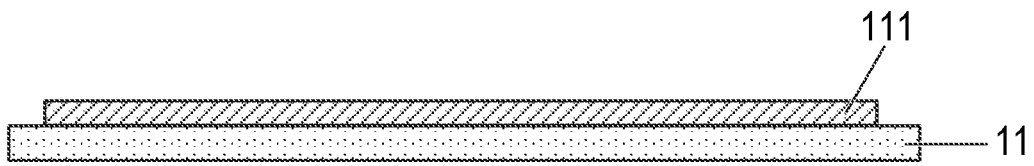
FIGS. 3A to 3G, shows a method for producing an exemplary substrate according to one example.
Figure 3B:
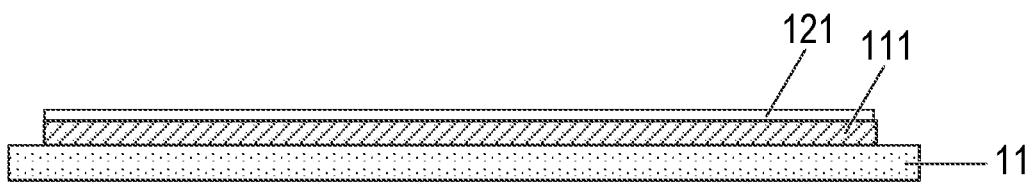
Figure 3C:
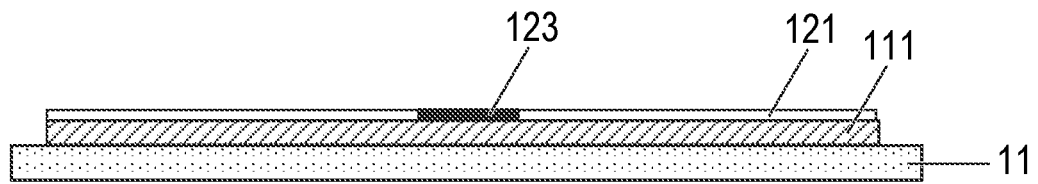

In a first step, the first electrically conductive layer 111 is formed on the dielectric insulation layer 11 (cf. FIG. 3A). Appropriate methods for forming such an electrically conductive layer (e.g., metallization layer) are known and will therefore not be described in more detail here. Optionally, in the same step or a subsequent step, a second electrically conductive layer 112 (see FIG. 1) can also be formed on the dielectric insulation layer 11. At least the first electrically conductive layer 111 is subsequently structured. For this purpose, a masking layer 121 is first applied on the surface of the first electrically conductive layer 111 (cf. FIG. 3B). This can, for example, be a coating layer (e.g., photoresist). The masking layer 121 can, for example, be evenly applied on the first electrically conductive layer by means of spin coating. The masking layer 121 can, for example, be subsequently stabilized. What subsequently follows is an exposure step (cf. FIG. 3C). This usually involves using a glass mask coated with chromium. As a result, some regions of the masking layer 121 are exposed and others are not. Depending on the nature of the material (coating) used, exposed parts of the masking layer 121 become soluble or insoluble. With the aid of a developer solution, the soluble regions of the masking layer 121 are subsequently removed. The soluble region of the masking layer 121 is darkly depicted in FIG. 3C.

Figure 3D:
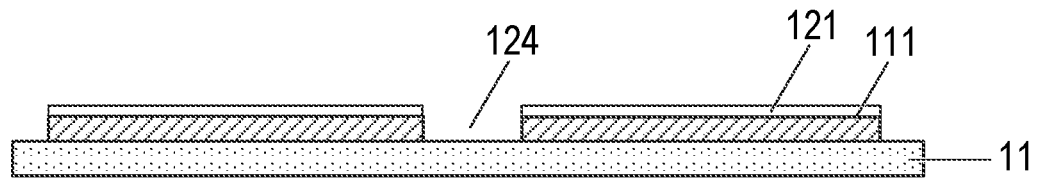

After the soluble regions of the masking layer 121 have been removed, at least one trench 124 can be formed in the first electrically conductive layer 111 in a subsequent step (see FIG. 3D). For this purpose, it is, for example, possible to use appropriate etching methods, such as, for example, wet etching methods or dry etching methods. The at least one trench 124 is formed in such a way that it extends through the entire first electrically conductive layer 111. This means that the at least one trench 124 extends up to the dielectric insulation layer 11. As a result, it is possible to form various sections of the first electrically conductive layer 111 that no longer have a direct connection to one another. Instead, the various sections are completely separated from one another by corresponding trenches 124.

The masking layer 121 can still remain on the first electrically conductive layer 111 for the next step. In the next step (cf. FIG. 3E), a coating 31 is formed. Firstly, the coating 31 can cover at least the bottom and the side walls of the at least one trench 124. In addition, it is also possible that the coating 31 also covers the mask layer 121 at least in part. This depends, for example, on the materials used for the mask layer 121 and the coating 31. The mask layer 121 can, for example, comprise a conventional suitable photoresist or dry resist or an inorganic material. The coating 31 can, for example, comprise a polymer or a polyimide. For example, some materials adhere on the mask layer 121, whereas other materials adhere only on the ceramic of the dielectric insulation layer 11 (bottom of the trench 124) and metals (side walls of the trench 124 or side walls of the sections of the first electrically conductive layer 111), but not on the mask layer 121.

The at least one trench 124 can be at least partly filled with the coating 31. However, it is also possible to completely fill the trench 124 with the coating 31, as will be described in more detail below.

Figure 3E:
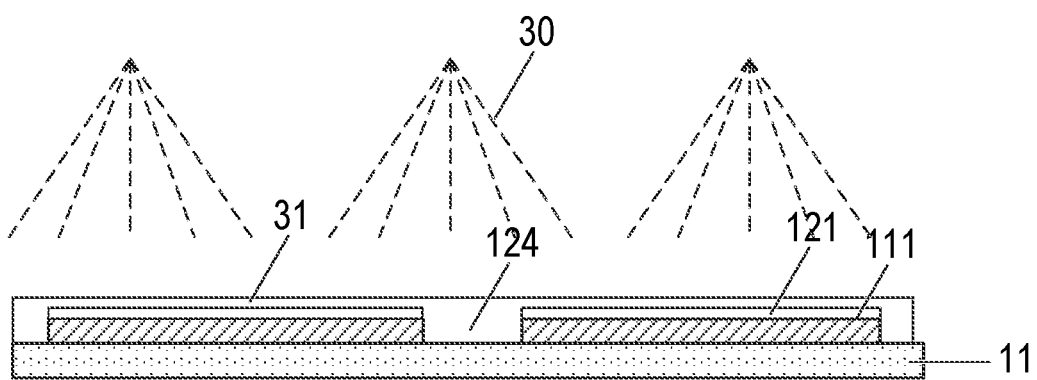
Figure 4:
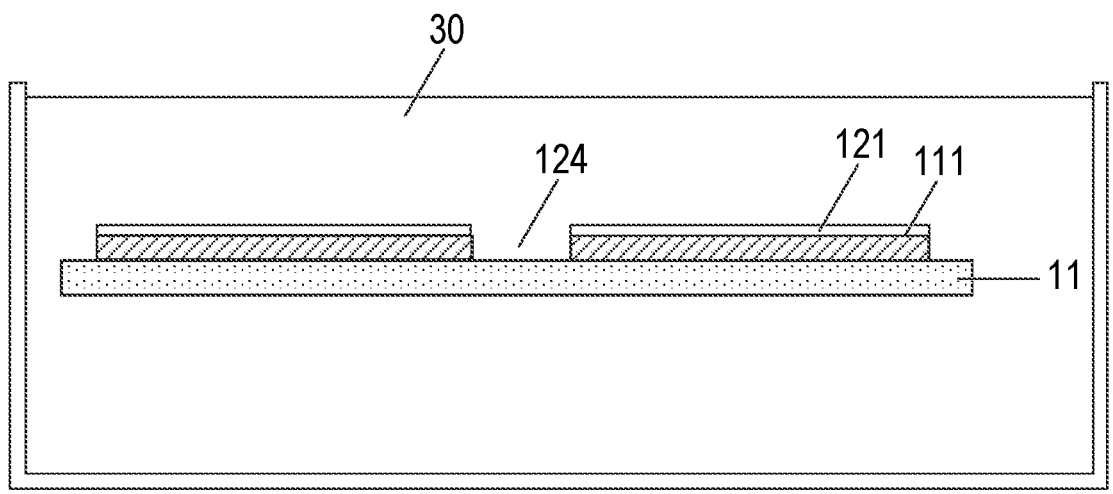
FIG. 4 shows an alternative to the step depicted in FIG. 3E.

The coating 31 can be formed by means of various suitable methods. In FIG. 3E, a spray coating method is depicted by way of example. This involves spraying the material 30 of the coating 31 extensively onto the substrate 10. The top sides of the first electrically conductive layer 111 are protected by the mask layer 121 and are therefore not directly covered by the coating 31. Other possible methods for applying the coating 31 are, for example, dip coating methods, powder coating methods, thermal spraying methods, plasma coating methods, or dispensing methods. A dip coating method is depicted in FIG. 4 by way of example. This involves completely dipping the entire substrate 10 into an appropriate material 30 which deposits on the surfaces of the substrate 10 and, optionally, on the surfaces of the mask layer 121.

Figure 3F:
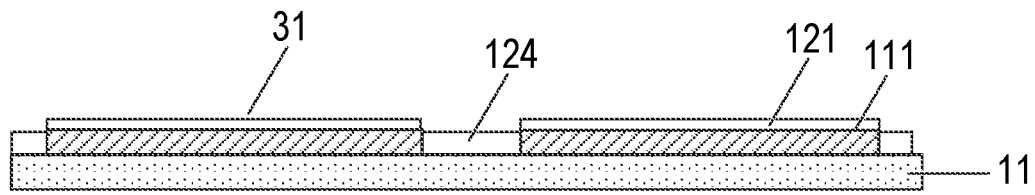
Figure 5:
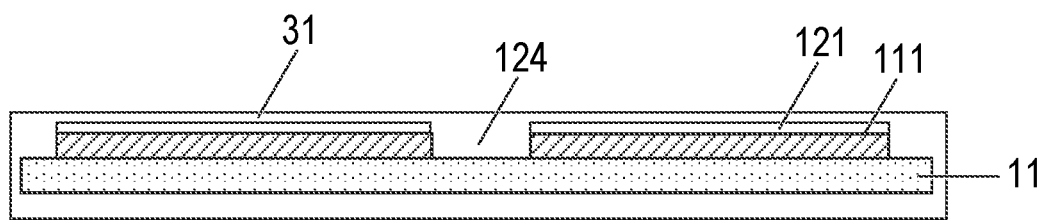
FIG. 5 shows by way of example a cross-section through a substrate directly after performance of the step from FIG. 4.

With all these methods, the coating can be applied extensively, i.e., not exclusively only in the at least one trench 124. This is depicted in FIG. 5 by way of example. The coating 31 can be subsequently removed from the mask layer 121, for example, whereas it is left in the at least one trench 124 (cf. FIG. 3F). For this purpose, methods can be used in which the coating 31 is removed selectively in the desired regions, whereas it remains at least in the at least one trench 124. For example, dry etching methods using inductively coupled plasma etching (ICP) or reactive ion etching methods (RIE) can be used. But grinding methods, laser ablation, sandblasting or dry ice blasting as well can be used for selective removal of the coating 31. Equally, it is possible to remove the coating 31 from the mask layer 121 by means of a water jet or air jet. Before or after the step to remove the coating 31 from the mask layer 121 as depicted in FIG. 3F by of example, it is optionally additionally possible to carry out a step in which the coating 31 is cured. The coating 31 is often applied in liquid or viscous form on the substrate 10 and therefore still contains much moisture. Said moisture can be at least partially removed, for example by heating of the coating 31.

Figure 3G:
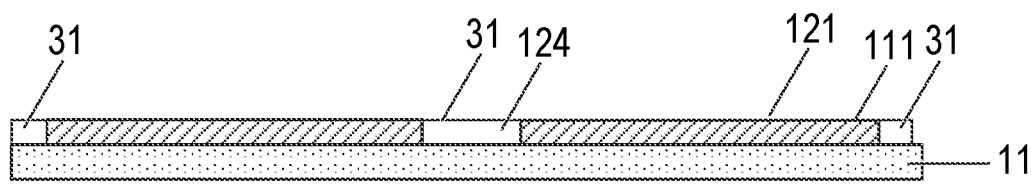

Thereafter, the mask layer 121 can then also be removed (cf. FIG. 3G). The mask layer 121 can, for example, be removed by means of suitable etching solutions (remover), in a dry etching step or with suitable solvents. The solvent used can, for example, be acetone. It removes the mask layer 121, but does not attack other layers such as the coating 31 in the trench 124 or the first electrically conductive layer 111.

The extensive application of the material 30 or the coating 31 on the mask layer 121 is, however, merely an example. As already explained above, some materials which can be used for the coating 31 cannot adhere on the mask layer 121, meaning that it cannot be covered at all by the coating 31. However, it is also possible that only parts of the mask layer are covered with the coating 31, for example those parts of the mask layer 121 that are arranged directly adjacent to a trench 124. This can, for example, be achieved by the material 30 being applied selectively only in certain regions, so that the bottom and the side walls of the trenches 124 are sufficiently covered. In this case, material can also reach adjacent regions of the mask layer 121. If at least some regions of the mask layer 121 remain uncovered by the coating 31, the mask layer 121 can, for example, be removed first by means of suitable methods, for example wet chemical etching. Removal can also be achieved by, for example, decomposition of the mask layer 121 in a reactive gas atmosphere or at an elevated temperature, especially if the mask layer 121 is less temperature-stable or less reactive than the coating 31. If the mask layer 121 is removed first, this results in remnants of the coating 31 which float freely above the first electrically conductive layer 111. Such remnants could be subsequently removed by means of suitable methods, for example sand blasting, compressed air or water jet, while the coating 31 remains in the trenches 124.

Figure 6C:
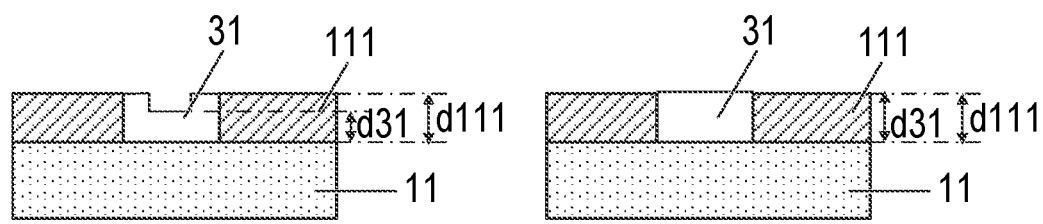
Figure 6C:
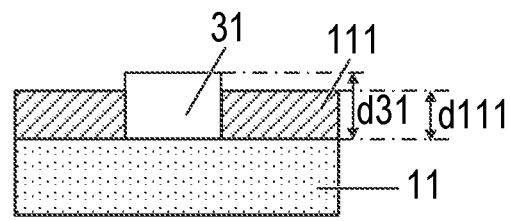

As already explained, the at least one trench 124 can be at least partly filled with the coating 31. An incompletely filled trench 124 in which, however, at least the bottom and the side walls of the trench 124 are covered with the coating is depicted in FIG. 6A by way of example. The coating 31 has here a thickness d31 which is smaller the thickness d111 of the first electrically conductive layer 111 in the same direction. However, it is, as depicted in FIG. 6B by way of example, likewise possible to completely fill the trench 124 with the coating 31. In this case, the coating 31 has a thickness d31 which corresponds to the thickness d111 of the first electrically conductive layer 111. As depicted in FIG. 6C by way of example, it is, in principle, equally possible that the coating 31 has a thickness d31 which is greater than the thickness d111 of the first electrically conductive layer 111 in the same direction. This means that the coating 31 can even protrude beyond the trench 124 to a certain extent. However, in this case, the coating 31 does not cover the top side of the first electrically conductive layer 111, since the first electrically conductive layer 111 is protected by the mask layer 121 during the forming of the coating 31.

The described method is highly effective, since the mask layer 121 which is fundamentally required for the forming of the at least one trench 124 is at the same time also used during the forming of the coating 31. Therefore, a second, additional mask layer is not necessary to prevent the coating 31 from also covering parts of the surface of the first electrically conductive layer 111.

Figure 2:
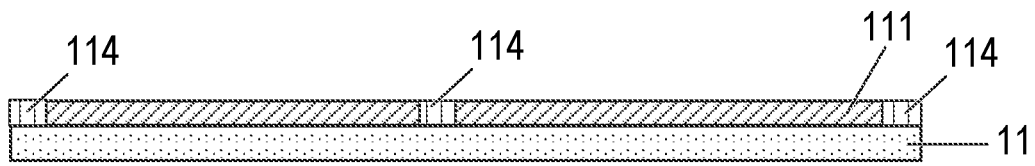
FIG. 2 shows by way of example a cross-section through a substrate having a coating in gaps between various sections of the first electrically conductive layer.

As depicted in FIG. 2, edge regions of the dielectric insulation layer 11 can also be covered with the coating 114, 31 in addition to the at least one trench 124. As depicted in the figures by way of example, it is possible that the first electrically conductive layer 111 does not completely cover the dielectric insulation layer 11. Edge regions of the dielectric insulation layer 11 can, for example, be not covered by the first electrically conductive layer 111. This means that, besides the regions of the dielectric insulation layer 11 which are arranged below the at least one trench 124, the edge regions of the dielectric insulation layer 11 can also be uncovered. Such regions of the dielectric insulation layer 11, and also the correspondingly adjacent side walls of the first electrically conductive layer 111, can, too, be covered with the coating 114, 31. As a result, such surfaces are also sufficiently protected. The coating 31 in the edge regions can be effected during the same steps during which the coating 31 is also formed in the at least one trench 124.

The invention claimed is:

1. A method which comprises:
forming a first electrically conductive layer on a first side of a dielectric insulation layer;
forming a structured mask layer on a side of the first electrically conductive layer that faces away from the dielectric insulation layer;
forming at least one trench in the first electrically conductive layer, said at least one trench extending through the entire first electrically conductive layer to the dielectric insulation layer;
forming a coating which covers at least the bottom and the side walls of the at least one trench; and
removing the mask layer after the coating has been formed,
wherein the forming of the structured mask layer comprises:
applying a photoresist, dry resist or inorganic material;
exposing the photoresist, dry resist or inorganic material; and
developing the photoresist, dry resist or inorganic material.

2. The method as claimed in claim 1, wherein the forming of the coating comprises:
applying material by means of a spray coating method, or
applying material by means of a dip coating method, or
applying material by means of a powder coating method, or
applying material by means of a thermal spraying method, or
applying material by means of a plasma coating method, or
applying material by means of a dispensing method.

3. The method as claimed in claim 2, wherein the forming of the coating additionally comprises the curing of the applied material.

4. The method as claimed in claim 1, wherein the coating comprises a polymer or a polyimide.

5. The method as claimed in claim 1, wherein the forming of the coating comprises the complete filling of the at least one trench.

6. The method as claimed in claim 1, wherein the first electrically conductive layer is formed in such a way that it does not cover an edge region of the dielectric insulation layer and wherein the method additionally comprises:
forming the coating on the edge region of the dielectric insulation layer that is not covered by the first electrically conductive layer.

7. The method as claimed in claim 1, wherein the dielectric insulation layer comprise ceramic and the first electrically conductive layer comprises a metal.

8. The method as claimed in claim 1, wherein the forming of the at least one trench comprises the etching of the at least one trench by means of a wet etching method or a dry etching method.

9. The method as claimed in claim 1, wherein the coating is additionally formed on surfaces of the mask layer and wherein the method additionally comprises:
removing the coating from surfaces of the mask layer before the mask layer is removed.

10. The method as claimed in claim 9, wherein the coating is removed from surfaces of the mask layer by means of any one of the following methods:
dry etching methods using inductively coupled plasma etching;
reactive ion etching methods;
grinding methods;
laser ablation;
sandblasting;
dry ice blasting; and
removal by means of a water jet or air jet.

11. A method which comprises:
forming a first electrically conductive layer on a first side of a dielectric insulation layer;
forming a structured mask layer on a side of the first electrically conductive layer that faces away from the dielectric insulation layer;
forming at least one trench in the first electrically conductive layer, said at least one trench extending through the entire first electrically conductive layer to the dielectric insulation layer;
forming a coating which covers at least the bottom and the side walls of the at least one trench; and
removing the mask layer after the coating has been formed,
wherein the forming of the coating comprises:
applying material by means of a spray coating method, or
applying material by means of a dip coating method, or
applying material by means of a powder coating method, or
applying material by means of a thermal spraying method, or
applying material by means of a plasma coating method, or
applying material by means of a dispensing method.

12. A method which comprises:
forming a first electrically conductive layer on a first side of a dielectric insulation layer;
forming a structured mask layer on a side of the first electrically conductive layer that faces away from the dielectric insulation layer;
forming at least one trench in the first electrically conductive layer, said at least one trench extending through the entire first electrically conductive layer to the dielectric insulation layer;
forming a coating which covers at least the bottom and the side walls of the at least one trench; and
removing the mask layer after the coating has been formed,
wherein the first electrically conductive layer is formed in such a way that it does not cover an edge region of the dielectric insulation layer and wherein the method additionally comprises:
forming the coating on the edge region of the dielectric insulation layer that is not covered by the first electrically conductive layer.

13. A method which comprises:
forming a first electrically conductive layer on a first side of a dielectric insulation layer;
forming a structured mask layer on a side of the first electrically conductive layer that faces away from the dielectric insulation layer;

forming at least one trench in the first electrically conductive layer, said at least one trench extending through the entire first electrically conductive layer to the dielectric insulation layer;

forming a coating which covers at least the bottom and the side walls of the at least one trench; and removing the mask layer after the coating has been formed, wherein the coating is additionally formed on surfaces of the mask layer and wherein the method additionally comprises:

removing the coating from surfaces of the mask layer before the mask layer is removed.

14. A method which comprises:

forming a first electrically conductive layer on a first side of a dielectric insulation layer;

forming a structured mask layer on a side of the first electrically conductive layer that faces away from the dielectric insulation layer;

using the structured mask layer to form at least one trench in the first electrically conductive layer, said at least one trench extending through the entire first electrically conductive layer to the dielectric insulation layer;

forming a coating which covers at least the bottom and the side walls of the at least one trench; and removing the mask layer after the coating has been formed, wherein the coating is additionally formed on surfaces of the mask layer and wherein the method additionally comprises:

removing the coating from surfaces of the mask layer before the mask layer is removed.

* * * * *